(12) United States Patent
Berquist et al.

(10) Patent No.: US 6,542,044 B1
(45) Date of Patent: Apr. 1, 2003

(54) INTEGRATED FREQUENCY SOURCE

(75) Inventors: Roy W. Berquist, Toddville, IA (US); Richard A. Freeman, Cedar Rapids, IA (US); Robert A. Newgard, Central City, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/659,230

(22) Filed: Sep. 11, 2000

(51) Int. Cl.[7] .................................................. H03L 1/00
(52) U.S. Cl. ........................... 331/176; 331/18; 331/66; 331/25; 327/105; 455/260
(58) Field of Search ........................... 331/176, 16, 18, 331/25, 66; 327/105; 455/260

(56) References Cited

U.S. PATENT DOCUMENTS

| | | | |
|---|---|---|---|
| 4,305,041 A | 12/1981 | Frerking | 328/155 |
| 4,513,259 A | 4/1985 | Frerking | 331/176 |
| 4,906,944 A | 3/1990 | Frerking | 331/1 A |
| 5,038,117 A | 8/1991 | Miller | 331/16 |
| 5,126,699 A * | 6/1992 | Kabler | 331/176 X |
| 5,216,389 A * | 6/1993 | Carralero et al. | 331/18 |
| 5,848,355 A * | 12/1998 | Rasor | 455/260 |

* cited by examiner

Primary Examiner—Arnold Kinkead
(74) Attorney, Agent, or Firm—Nathan O. Jensen; Kyle Eppele (57) ABSTRACT

An integrated frequency source with an integrated frequency standard and an integrated frequency synthesizer is disclosed. A voltage-controlled oscillator in the frequency standard is eliminated with a resulting improvement in phase noise. A reference frequency in the frequency standard is provided directly to the frequency synthesizer. The integrated frequency source is put on frequency over temperature by storing reference frequency errors over temperature in a lookup table, measuring the temperature, and calculating in a microprocessor synthesizer control data that offsets the synthesizer to compensate for reference frequency errors.

9 Claims, 5 Drawing Sheets

Fig. 1

PRIOR ART

INTEGRATED FREQUENCY SOURCE

BACKGROUND OF THE INVENTION

This invention relates to communications and avionics frequency standards, frequency synthesizers, and more specifically to an integrated frequency source with an integrated frequency standard and frequency synthesizer.

Frequency standards and frequency synthesizers are widely used in radio communications, avionics, and other applications to provide reference frequencies and frequencies needed to generate desired output frequencies. Currently the frequency standard and the frequency synthesizer are designed and constructed as two separate modules.

With current practice, the frequency standard signal is distributed throughout the radio or other equipment. The frequency synthesizer and other modules in the radio must then condition the frequency standard signal to meet the module's needs such as filtering, multiplying up in frequency, dividing down in frequency, etc. thereby requiring additional circuitry in each module. Typically, the frequency standard is a crystal oscillator with low frequency signals such as about 10 MHz due to optimum crystal design at that frequency. The frequency standard must maintain a constant output frequency with variations in temperature. The frequency standard may be a temperature compensated crystal oscillator (TCXO), an ovenized crystal oscillator, or other types of frequency standards known in the art.

The TCXO maintains a constant output frequency by pulling of the frequency standard crystal requiring the output of the frequency standard to be a voltage controlled crystal oscillator (VCXO). The VCXO requires a crystal that is easily pulled to frequency (low inductance) and circuitry to pull the crystal to frequency such as a varactor. The introduction of the circuitry to pull the crystal to frequency allows spurious frequencies to modulate the frequency standard. The requirement to pull the crystal also requires a low crystal current, which means the phase noise can degenerate. If a higher crystal current is used the phase noise of the oscillator can be lowered but pullability of the crystal is reduced. Low phase noise is required from the frequency standard to optimize synthesizer and ultimately radio performance. Multiplication of the frequency standard signal to achieve the desired output frequencies also multiplies the phase noise requiring low reference frequency phase noise. The very nature of a VCXO in a TCXO limits the achievable phase noise.

An ovenized crystal oscillator can achieve better phase noise than a TCXO since the ovenized crystal oscillator does not have the circuitry to pull the crystal to frequency. The required frequency accuracy in an ovenized crystal oscillator is obtained by placing the crystal in an oven to maintain the crystal at a constant temperature. However, the ovenized crystal oscillator is not suited for most communications and avionics applications due to its high power consumption and large size.

The development of a time compensated clock oscillator (TCCO) has enabled significant improvements in frequency stability approaching that of ovenized oscillators with reduced size and power consumption. However current TCCO frequency standard designs employ a VCXO with the attendant problems of a VCXO in a TCXO. Current TCCO frequency standards are implemented as standalone module.

Several different approaches exist for implementation of frequency synthesizers as standalone modules. Among these are indirect phase lock loop synthesizers (PLL) and direct digital synthesizers (DDS). Each of these approaches has advantages and disadvantages. A desirable feature in frequency synthesizers is small frequency step size. Indirect phase lock loop synthesizer step size is limited to the reference frequency. Indirect phase lock loop synthesizers can offer small step size with a low reference frequency but a low reference frequency results in a narrow bandwidth loop with slow tune times.

Modulated fractional divider (MFD) phase lock loop synthesizers have been developed that provide very small frequency step size with high frequency standard reference frequencies. This is possible with the addition of a modulated fractional divider in the phase lock loop of a conventional synthesizer that divides by fractional values.

A direct digital synthesizer (DDS) may be used to generate small frequency step sizes with a high reference frequency. However, the DDS output has high spurious content and may require the use of a phase lock loop to filter the DDS output.

With current practice of building the frequency standard and the frequency synthesizer as two separate modules requires that each module is packaged separately and each module contain its own controller and associated parts. Reducing the parts count in the frequency standard and synthesizer would allow a reduction in size and cost with an increase in reliability.

What is needed is an integrated frequency standard and frequency synthesizer design that eliminates the VCXO and associated circuitry to improve noise and spurious performance while eliminating a module and reducing parts count.

SUMMARY OF THE INVENTION

An integrated frequency source comprising an integrated frequency standard and an integrated frequency synthesizer for generating a desired frequency over a temperature range is disclosed. The integrated frequency standard receives frequency control data and generates synthesizer control data and a reference signal. The integrated frequency synthesizer is connected to the integrated frequency standard and generates an output signal at the desired frequency from the synthesizer control data and the reference signal.

The integrated frequency standard further comprises a reference oscillator for generating the reference signal and a temperature sensor for measuring temperature and providing a measured temperature signal. A microprocessor is connected to the reference oscillator, the temperature sensor, and the frequency synthesizer for generating the synthesizer control data from the frequency control data, the reference signal, and the measured temperature signal.

The microprocessor uses a lookup table to determine a reference frequency error at a measured temperature and then calculates the synthesizer control data for that temperature. The microprocessor calculates the synthesizer control data needed to compensate for a change in reference frequency with temperature.

The integrated frequency synthesizer of the integrated frequency source may be a modulated fractional divider phase lock loop that further comprises a modulated fractional divider that divides in accordance with the synthesizer control data to provide the desired output frequency over temperature. A direct digital synthesizer or other frequency synthesizer capable of tuning in small frequency steps may also be used.

It is an object of the present invention to provide an integrated frequency source with an integrated frequency standard and an integrated frequency synthesizer in a single module.

It is an advantage of the present invention to provide an integrated frequency source that eliminates a voltage controlled crystal oscillator to improve phase noise and spurious signal performance.

It is a feature of the present invention to allow a reduction in parts count, cost, and size.

BRIEF DESCRIPTION OF THE DRAWINGS

The invention may be more fully understood by reading the following description of the preferred embodiments of the invention in conjunction with the appended drawings wherein.

DETAILED DESCRIPTION

Figure 1:
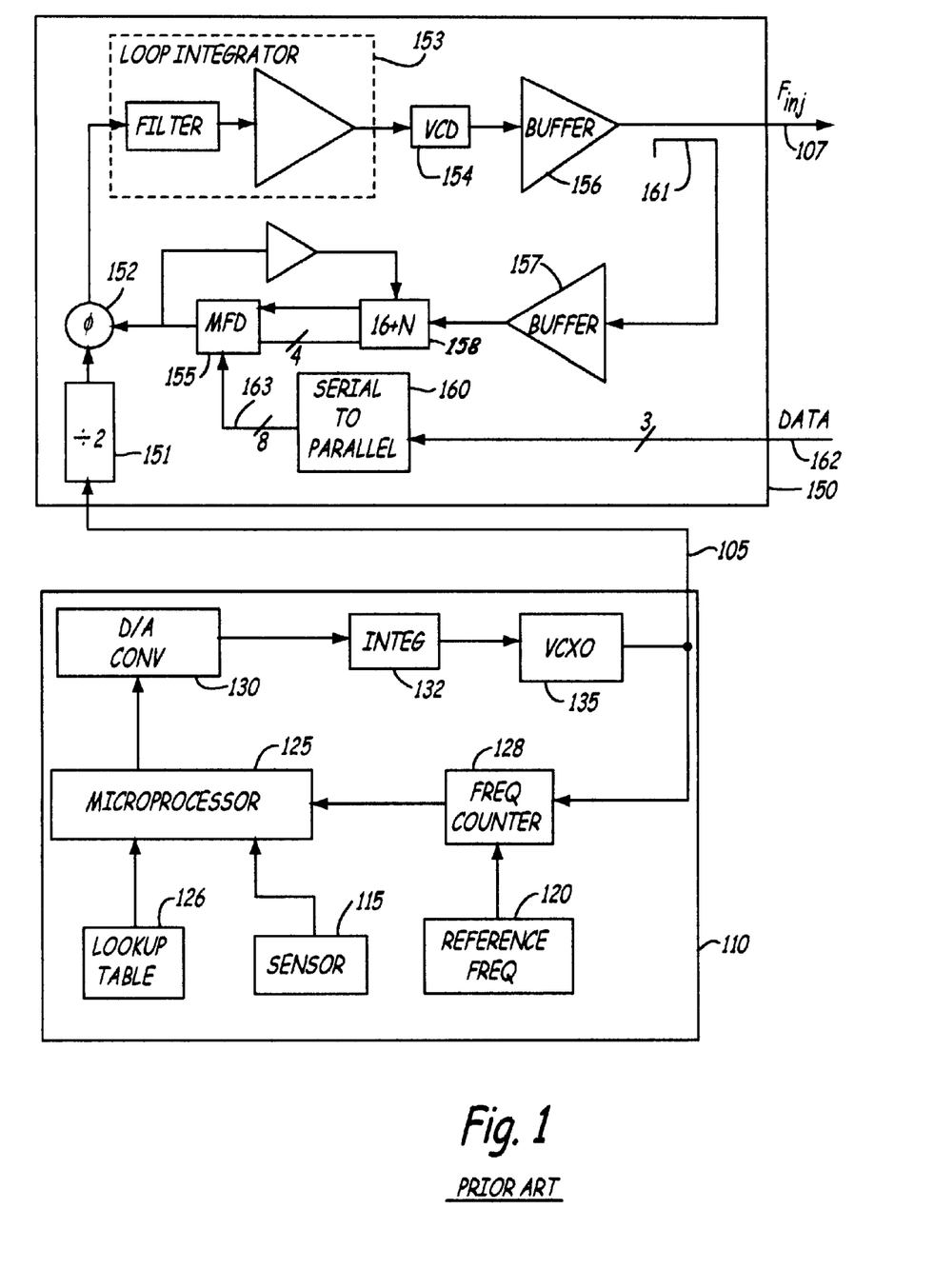
FIG. 1 is a block diagram of a separate frequency standard and frequency synthesizer as is current practice in the art.

FIG. 1 is a block diagram of a prior art configuration of a frequency standard 110 and a frequency synthesizer 150. The frequency standard 110 is a time compensated clock oscillator (TCCO). The TCCO and its variations are subjects of U.S. Pat. Nos. 4,305,041, 4,513,259, and 4,906,944 incorporated herein by reference. The frequency synthesizer 150 is a phase locked loop with a modulated fractional divider (MFD) 155 known in the art and subject of U.S. Pat. No. 5,038,117 incorporated herein by reference.

The TCCO frequency standard 110 in FIG. 1 may utilize three crystal oscillators. One crystal oscillator is used as a temperature sensor 115, another as a reference oscillator 120, and the third is a voltage controlled crystal oscillator (VCXO) 135 that provides an output signal to the frequency synthesizer 150.

Within the frequency standard 110, the VCXO 135 output signal is fed to a frequency counter 128 where its frequency is compared with the reference oscillator 120 frequency by using the reference oscillator 120 as a time base for the frequency counter 128. The output of the frequency counter 128 is sent to a microprocessor 125. The reference oscillator 120 crystal may use a SC-cut crystal or other high stability crystal. Frequency errors as a function of temperature of the SC-cut reference crystal are stored in a non-volatile memory such as a PROM used as a lookup table 126. The frequency errors over temperature are determined in calibration runs during initial test and calibration of the TCCO.

The temperature sensor 115 is a precision temperature sensing means to determine the temperature of the SC-cut crystal to a typical accuracy of 0.001 degree C. The temperature sensor 115 may be a crystal or other oscillator whose frequency varies with temperature in a predictable manner. A lag may exist between the temperature sensor reading and the actual temperature of the reference oscillator crystal. An IIR (infinite impulse response) filter (not shown) may be used to correct for the time lag by providing a delay to compensate for the temperature reading lag. The transient response of a crystal is an offset in frequency caused by a change in temperature. The amount of frequency offset is proportional to the rate of temperature change. Transient response of the TCCO may be improved by calculating the rate of temperature change and using the result to calculate the frequency shift and adding this to the frequency.

The microprocessor 125 counts the frequency of the temperature sensor oscillator 115 to determine the temperature. With a change in temperature, the temperature sensor 115 measures a new temperature and a frequency correction for the reference crystal in reference oscillator 120 is determined from the stored error information in the lookup table 126 by the microprocessor 125. The frequency correction is applied to the frequency counter 128 measurement in the microprocessor 125. The frequency counter 128 output at a first temperature is compared to a frequency counter output at a second temperature in the microprocessor 125. From the frequency counter 128 measurements at the two temperatures, the change in the VCXO 110 frequency over temperature is calculated by the microprocessor 125.

The microprocessor 125 then calculates an appropriate digital word to be applied to a D/A converter 130 where it is converted to an error voltage and applied to the VCXO 135 to correct the frequency of the VCXO 135 at the new temperature. An integrator 132 may be included to provide a continuous voltage control signal to the VCXO 135. Other embodiments of the TCCO are known in the art and described in the patents previously mentioned and incorporated by reference.

The frequency synthesizer 150 of FIG. 1 is shown as a modulated fractional divider phase lock loop that uses the output 105 of the frequency standard 110 as a reference frequency. The output 105 of the frequency standard 110 may be conditioned by a divider 151, filtered, or otherwise processed before being sent to a phase detector 152. Frequency control data 162 to set a desired frequency of the frequency synthesizer 150 from a control source (not shown) may be converted from serial to parallel format in a serial-to-parallel converter 160. Synthesizer control data 163 from the serial-to-parallel converter 160 is used to set the desired frequency of the synthesizer 150 by setting the divide ratio in a modulated fractional divider 155. The modulated fractional divider 155 enables division by a fractional value to allow frequency steps smaller than the reference frequency. The divide ratio is modulated in the MFD 155 by a sigma-delta modulator (not shown) to spread out spurious responses generated by fractional division as is known in the art. The output of the MFD 155 is connected to the phase detector 152. The output of the phase detector 152 is a phase lock loop phase error signal. A loop integrator 153 filters the phase detector 152 output and sets the loop bandwidth and response characteristics. The loop integrator 153 output controls a voltage-controlled oscillator (VCO) 154. The VCO 154 output may be buffered by a buffer amplifier 156 before being passed to some other radio function (not shown) as an injection or output signal 107. The buffered VCO output may be connected to another buffer 157 through some coupling means 161. The buffer 157 output is connected to a 16+N or other count prescaler 158 operating in cooperation with the MFD 155 to divide the VCO 154 output to complete the MFD phase locked loop.

Figure 2:
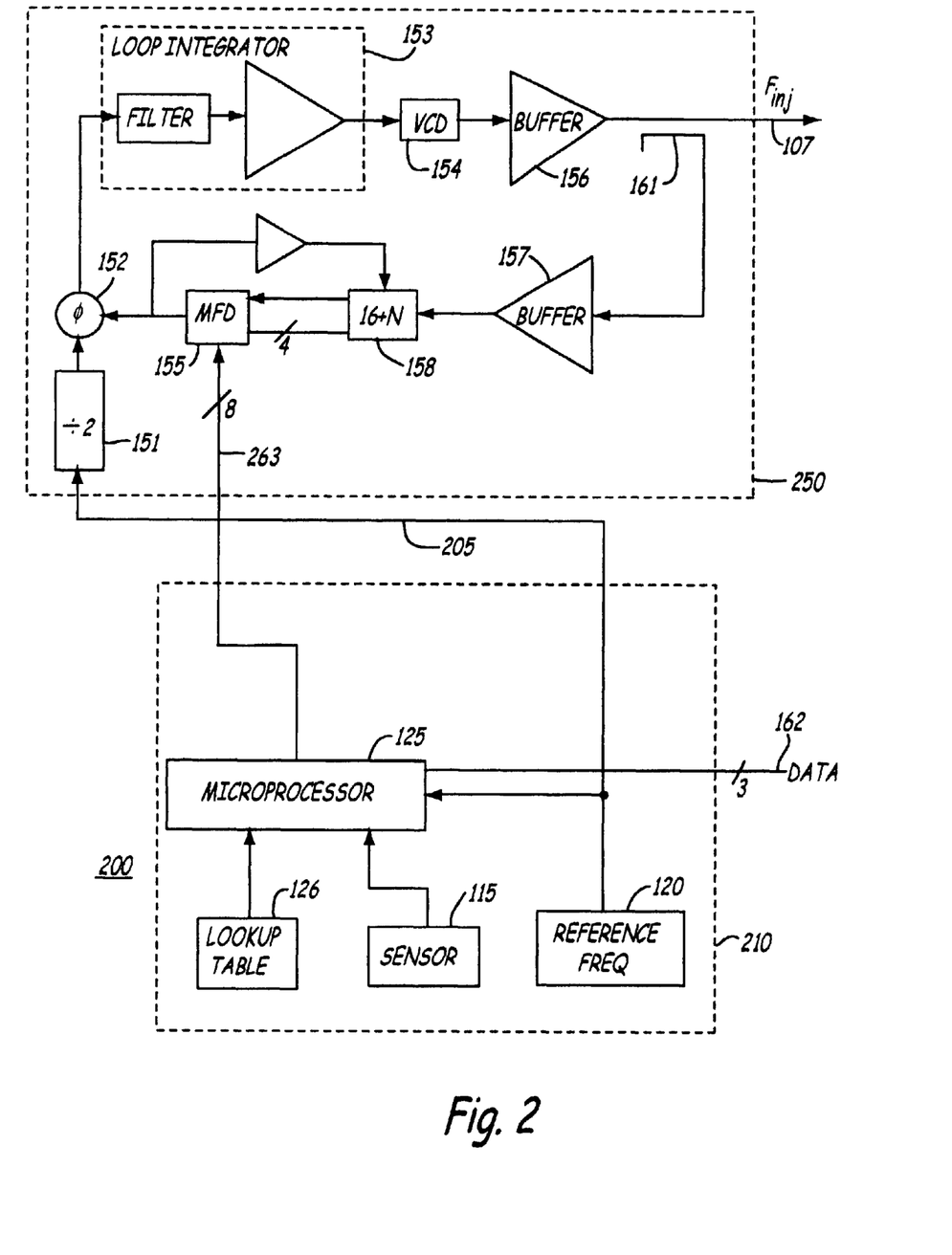
FIG. 2 is a block diagram of an integrated frequency source with an integrated standard and an integrated frequency synthesizer in accordance with an embodiment of the present invention.

A block diagram of an integrated frequency source 200 with an integrated frequency standard 210 and integrated frequency synthesizer 250 of the present invention is shown in FIG. 2. The integrated frequency synthesizer 250 is a modulated fractional divider phase lock loop as in FIG. 1. The integrated frequency synthesizer 250 in FIG. 2 has as its reference frequency the output signal 205 of the reference oscillator 120 in the integrated frequency standard 210 instead of the VCXO 135 output signal 105 of FIG. 1. The integrated frequency synthesizer 250 now receives its synthesizer control data 263 from the microprocessor 125 in the integrated frequency standard 210 instead of from the serial to parallel converter 160 as in FIG. 1. The MFD 155 divides in accordance with the synthesizer control data 263 to provide the desired output frequency from the integrated frequency reference 200. The remainder of the integrated frequency synthesizer 250 functions in a similar fashion as the frequency synthesizer 150 shown in FIG. 1 to provide an output signal 107 at a desired frequency.

In the integrated frequency source 200, the VCXO 135, integrator 132, and D/A converter 130 of the TCCO frequency standard 110 of FIG. 1 are eliminated in the integrated frequency standard 210 of FIG. 2. The remainder of the integrated frequency standard is the same as the TCCO frequency standard 110 of FIG. 1. In the integrated frequency standard 210, the temperature sensor 115 may be a crystal oscillator as before to provide a measured temperature signal to the microprocessor 125. The reference oscillator 120 provides a reference signal 205 for the integrated frequency standard 250. The microprocessor 125 receives frequency control data 162 from a control source (not shown) for a desired frequency or channel for the integrated frequency source 200. The microprocessor 125 determines a frequency error of the reference oscillator 120 at a measured temperature from the error correction data in the lookup table 126. The microprocessor 125 then calculates the synthesizer control data 263 with the required offset of the frequency synthesizer 250 to set the output of the integrated frequency source 200 to the desired frequency at the measured temperature. If the temperature changes, the microprocessor 125 determines a new reference frequency error from the error correction data in the lookup table 126 and again calculates the synthesizer control data 263 needed to compensate for a change in reference frequency with a change in temperature. The microprocessor 125 then continues to receive temperature measurements and to update the integrated frequency synthesizer 250 as the frequency of the reference oscillator 120 changes over temperature. If the frequency control data 162 changes due to a change in desired output frequency, the microprocessor 125 then calculates new synthesizer control data 263 for this change along with any change for reference frequency error.

The reference oscillator 120 uses a high-Q uncompensated crystal with good phase noise characteristics such as the SC-cut crystal or other high stability crystal used in FIG. 1. A SC-cut crystal can be driven at higher levels than a VCXO crystal thus improving phase noise. The reference oscillator 120 is allowed to change over temperature and the integrated frequency synthesizer 250 is offset to compensate for the change in reference oscillator 120 frequency. This operation is in sharp contrast to the convention approach where the frequency standard 110 of FIG. 1 is held to a high tolerance of frequency stability and the synthesizer 150 frequency is changed with the MFD 155 to set the desired frequency independent of temperature. There is no VCXO 135 to pull to the correct frequency as is done in the prior art thus eliminating the noise and spurious problems caused by the VCXO 135 and its associated control circuitry.

With the functions of the integrated frequency standard 210 and integrated frequency synthesizer 250 integrated as described above, the integrated frequency standard 210 and the integrated frequency synthesizer 250 may be packaged in a single module to further reduce parts count from that already shown. Filtering and buffering circuitry may be eliminated with a single module.

Figure 3:
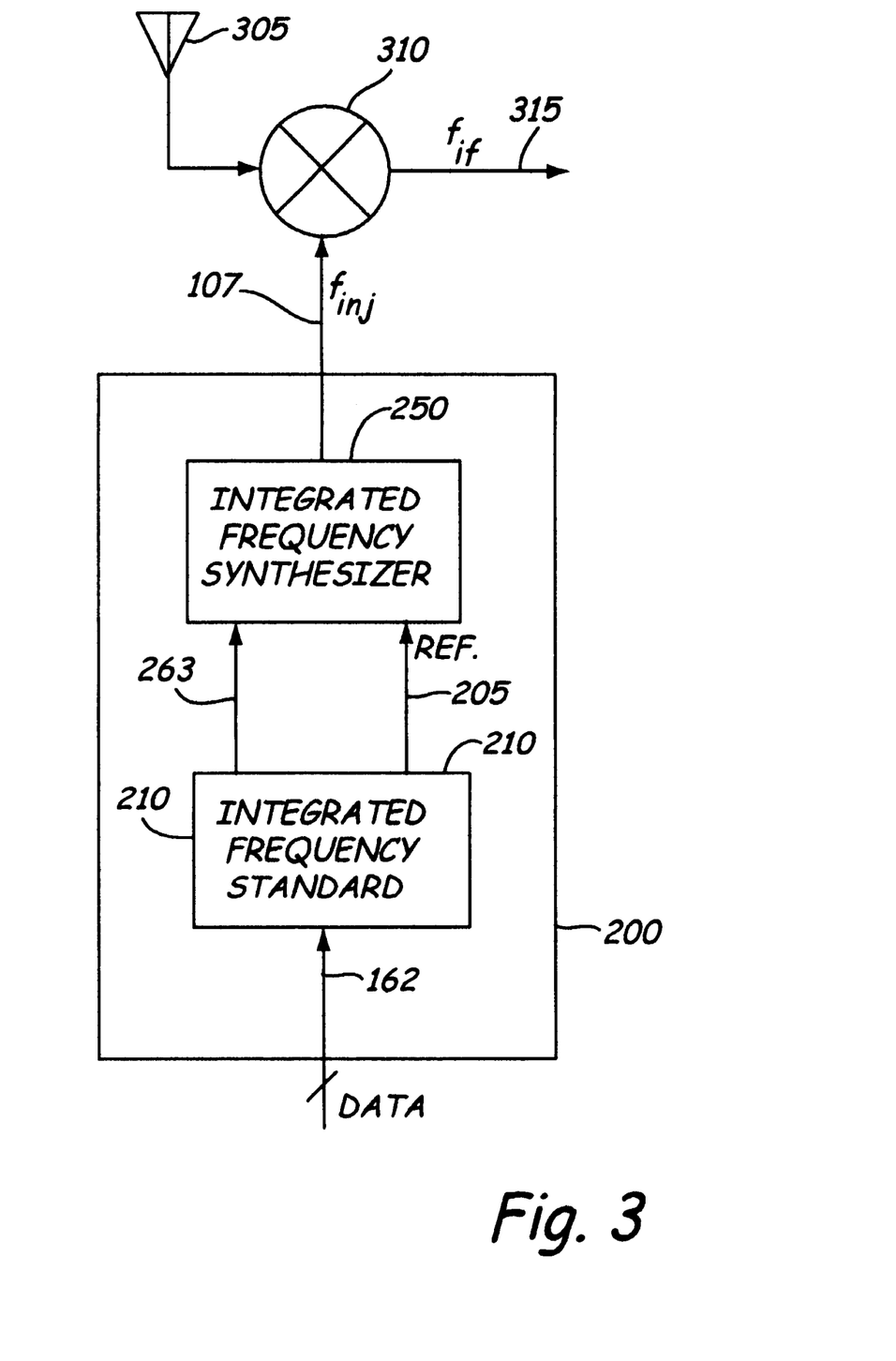
FIG. 3 is a block diagram of a simplified radio receiver showing operation of the present invention in exemplary fashion.

FIG. 3 is a simplified block diagram of a radio receiver showing the integrated frequency source 200 of the present invention connected to a mixer 310. In FIG. 3 an antenna 305 receives a radio signal and supplies the received signal to the mixer 310. The injection signal 107 is the output received from the integrated frequency source 200. The received signal and the injection signal 107 are mixed to supply an intermediate frequency (IF) signal 315. As an example of operation of the present invention, assume the received signal is 30 MHz and the radio receiver is designed with an IF frequency of 67.44 MHz. With high side injection, the injection signal 107 is 97.44 MHz as determined in Equation 1 as shown below:

$$f_{inj} = (aF + b)f_{ref}(1+k) \qquad \text{Equation 1}$$

where $f_{inj}$ = injection frequency
$a$ = loop multiplier
$b$ = loop offset
$F$ = frequency control data
$f_{ref}$ = reference frequency
$k$ = reference frequency stability.

With the received frequency of 30 MHz and the IF of 67.44 MHz, as an example assume that:

$a = 1 \times 10^{-6}$
$b = 67.44$
$F = 30 \times 10^6$ Hz
$f_{ref} = 1 \times 10^6$ Hz
$k = \pm 0.1$ ppm $= \pm 1 \times 10^{-7}$.

With the reference frequency error equal to zero (k=0) and the other parameters above substituted in Equation 1, the injection frequency is $$f_{inj} = [(1 \times 10^{-6})(30 \times 10^6) + 67.44] 1 \times 10^6$$

$$= 97.440000 \text{ MHz}$$

The reference frequency stability is ±0.1 ppm (part per million) or $1 \times 10^{-7}$. Using +0.1 ppm for the reference frequency error (k) in Equation 1 the injection frequency is $$f_{inj} = [(1 \times 10^{-6})(30 \times 10^6) + 67.44](1 \times 10^6 + .0000001)$$

$$= 97.440009744 \text{ MHz}.$$

As shown in the calculations above with the reference frequency error of +0.1 ppm, the injection frequency has increased 9.744 Hz.

Again using Equation 1 with the above reference frequency error but now assuming a constant injection frequency, the modified frequency control data $F_m$ is calculated below:

$f_{inj}=97.440000=[(1\times10^{-6})(F_m)+67.44)](1\times10^6+0.0000001)$ $97.439990256=[(1\times10^{-6})(F_m)+67.44)]$ $F_m=29.999990256$ MHz.

From the above calculations in this example, it can be seen that the injection signal 107 frequency from the integrated frequency synthesizer 250 must be decreased by 9.744 Hz to compensate for the increase in the reference frequency. The frequency control data 162 to the integrated frequency standard 210 calls for a frequency (F) of 30 MHz. The microprocessor in the frequency standard 210 determines that the frequency of the reference oscillator has increased by 0.1 ppm at a measured temperature from the lookup table 126. The microprocessor 125 calculates a frequency offset for the integrated frequency synthesizer 250 to a frequency ($F_m$) of 29.999990256 or 9.744 Hz. With a synthesizer capable of tuning in 2.44 Hz steps as is possible in the art with an MFD 155, this offset amounts to four tune steps or 4×2.44 or 9.76 Hz. The synthesizer control data 263 is offset four tune steps or 9.76 Hz.

Figure 4:
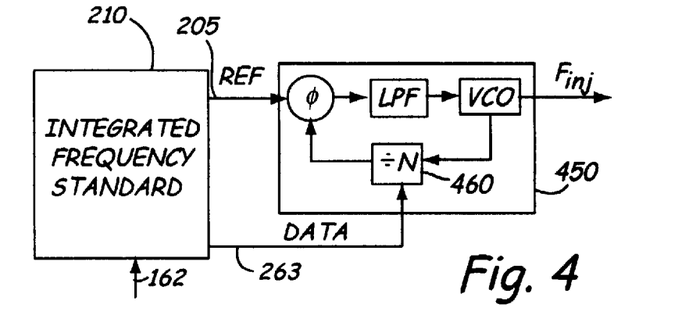
FIG. 4 is a block diagram of another embodiment of the present invention using conventional phase lock loop as the integrated frequency synthesizer.

The integrated frequency source 200 of present invention as shown in FIG. 2 may incorporate other methods of frequency synthesis known in the art such as direct digital synthesis, conventional phase lock loop synthesis, as well as modulated fractional divider phase lock loop synthesis, and combinations thereof. The integrated frequency synthesizer 250 shown as a modulated fractional divider in FIG. 2 may be replaced with a conventional phase lock loop synthesizer 450 as shown in FIG. 4. This embodiment of the invention utilizes the integrated frequency standard 210 of FIG. 2 as before to supply a reference frequency signal 205 to the integrated frequency synthesizer 450. The integrated frequency standard 210 calculates an offset due to changes in reference frequency over temperature as previously discussed. This offset is added to the frequency control data 162 to produce the synthesizer control data 263 to change a count in a divider 460 of the integrated frequency synthesizer 450 to compensate for changes in reference frequency. The conventional phase lock loop synthesizer used as the integrated frequency synthesizer 450 must be designed to provide a frequency step size small enough to accommodate changes in reference frequency.

Figure 5:
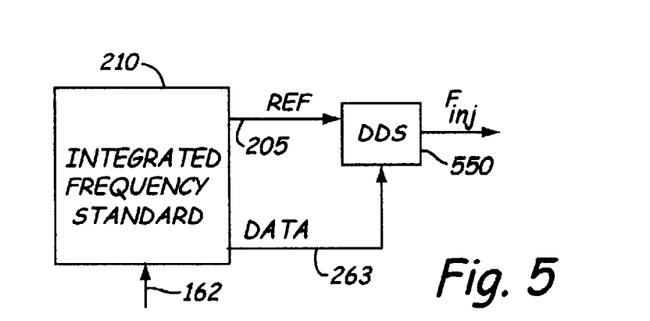
FIG. 5 is a block diagram of another embodiment of the present invention using a direct digital synthesizer as the integrated frequency synthesizer.

Another embodiment of the present invention is shown in FIG. 5. In this embodiment a direct digital synthesizer known in the art is used as an integrated frequency synthesizer 550. The integrated frequency standard 210 again provides the reference frequency signal 205 and synthesizer control data 263 with offsets for variations in reference frequency over temperature added to the frequency control data 162 to the integrated frequency synthesizer 550. A count in the direct digital synthesizer phase accumulator (not shown) is changed to provide the compensation. A direct digital synthesizer is capable of providing the required small frequency step size to accommodate changes in reference frequency over temperature.

Figure 6:
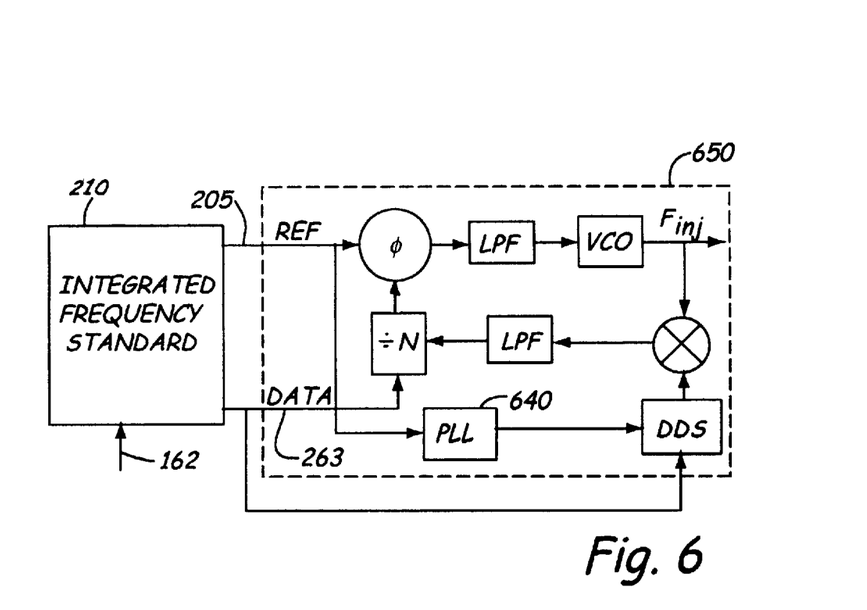
FIG. 6 is a block diagram of another embodiment of the present invention using a combined phase lock loop/direct digital synthesizer as the integrated frequency synthesizer.

An embodiment of the present invention that combines a direct digital synthesizer (DDS) with a phase lock loop (PLL) by mixing the outputs of the two as is known in the art is shown in FIG. 6. The combined DDS/PLL synthesizer is used as the integrated frequency synthesizer 650. In this approach, the PLL and the DDS (through another PLL 640) both use the reference frequency signal 205 from the integrated frequency standard 210. The synthesizer control data 263 is also supplied to both the DDS and the PLL from the integrated frequency standard. Operation of the integrated frequency standard 210 remains the same as in the other embodiments of the invention. Counts are changed in both the PLL and DDS to provide compensation for variations in reference frequency.

Figure 7:
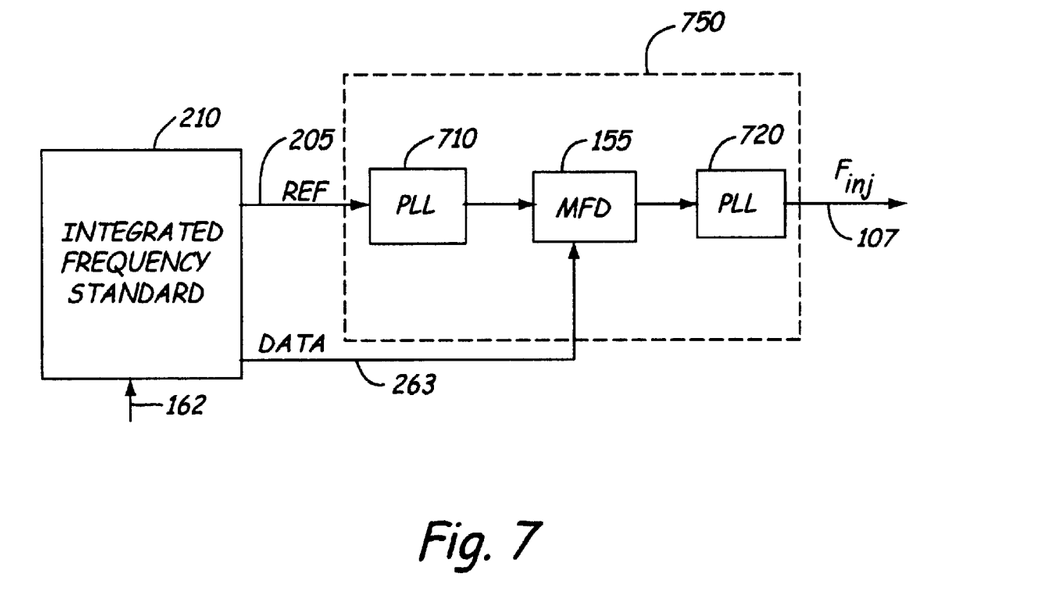
FIG. 7 is a block diagram of an embodiment of the present invention with an integrated frequency synthesizer incorporating a modulated fractional divider as a reference frequency divider.

The embodiment of the present invention shown in FIG. 2 incorporates the modulated fractional divider 155 in the feedback path of the phase lock loop. It is within the scope of the present invention to operate with a frequency synthesizer with the modulated fractional divider 155 in the reference frequency signal path 205 as shown in FIG. 7. In this embodiment the integrated frequency standard 210 provides the reference frequency signal 205 and synthesizer control data 263 with offsets for variations in reference frequency over temperature added to the frequency control data 162 to the integrated frequency synthesizer 750. Within the integrated frequency synthesizer 750, the MFD 155 receives the reference frequency signal 205 and divides it in accordance with the synthesizer control data 263. A phase lock loop 710 may be included in the reference frequency signal path 205. The MFD 155 output is connected to another PLL 720 as a reference signal to the PLL 720. The desired output signal with compensation for changes in reference frequency over temperature is obtained from PLL 720.

It is believed that the integrated frequency source of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An integrated frequency source for generating an output signal at a desired frequency over temperature comprising:

an integrated frequency standard for generating a reference signal and for receiving frequency control data and generating synthesizer control data to select the desired frequency and to compensate for frequency variations over temperature of the reference signal wherein said integrated frequency standard further comprises a reference oscillator for generating the reference signal;

a crystal oscillator for measuring a temperature and providing a measured temperature signal;

a microprocessor connected to the reference oscillator and the crystal oscillator for generating the synthesizer control data from the frequency control data, the reference signal, and the measured temperature signal; and an integrated frequency synthesizer connected to the integrated frequency standard for generating the output signal at the desired frequency from the synthesizer control data and the reference signal.

2. The integrated frequency source of claim 1 wherein the integrated frequency standard further comprises a lookup table to determine a reference signal frequency error for the measured temperature signal.

3. The integrated frequency source of claim 1 wherein the reference oscillator is a crystal oscillator.

4. The integrated frequency source of claim 1 wherein the integrated frequency synthesizer comprises a modulated fractional divider phase lock loop.

5. The integrated frequency source of claim 4 wherein the modulated fractional divider phase lock loop further comprises a modulated fractional divider that divides in accordance with the synthesizer control data from the integrated frequency standard to provide the output signal at the desired frequency.

6. An integrated frequency source for providing a desired frequency output signal comprising:

a temperature sensor for sensing temperature and providing a temperature signal;

a reference oscillator for providing a reference signal;

a lookup table to determine a reference frequency error from the temperature signal;

a microprocessor for receiving frequency control data, the temperature signal, and the reference signal to provide synthesizer control data to select the desired frequency and to compensate for frequency variations over temperature of the reference signal wherein said microprocessor further calculates and provides an offset in the synthesizer control data from the reference frequency error to provide the desired frequency output; and a frequency synthesizer to receive the reference signal and the synthesizer control data to provide the desired frequency output signal wherein said frequency synthesizer comprises a modulated fractional divider phase lock loop for providing the desired frequency output signal by changing a count in the modulated fractional divider in accordance with the offset in the synthesizer control data.

7. An integrated frequency source for providing a desired frequency output signal comprising:

a temperature sensor for sensing temperature and providing a temperature signal;

a reference oscillator for providing a reference signal;

a lookup table to determine a reference frequency error from the temperature signal;

a microprocessor for receiving frequency control data, the temperature signal, and the reference signal to provide synthesizer control data to select the desired frequency and to compensate for frequency variations over temperature of the reference signal wherein said microprocessor further calculates and provides an offset in the synthesizer control data from the reference frequency error to provide the desired frequency output; and a frequency synthesizer to receive the reference signal and the synthesizer control data to provide the desired frequency output signal wherein the frequency synthesizer comprises a conventional phase lock loop for providing the desired frequency output signal by changing a count in a divider in accordance with the offset in the synthesizer control data.

8. An integrated frequency source for providing a desired frequency output signal comprising:

a temperature sensor for sensing temperature and providing a temperature signal;

a reference oscillator for providing a reference signal;

a lookup table to determine a reference frequency error from the temperature signal;

a microprocessor for receiving frequency control data, the temperature signal, and the reference signal to provide synthesizer control data to select the desired frequency and to compensate for frequency variations over temperature of the reference signal wherein said microprocessor further calculates and provides an offset in the synthesizer control data from the reference frequency error to provide the desired frequency output; and a frequency synthesizer to receive the reference signal and the synthesizer control data to provide the desired frequency output signal wherein the frequency synthesizer comprises a direct digital synthesizer for providing the desired frequency output signal by changing a count in the direct digital synthesizer in accordance with the offset in the synthesizer control data.

9. An integrated frequency source for providing a desired frequency output signal comprising:

a microprocessor for receiving frequency control data, measuring a temperature, receiving a reference frequency, calculating a reference frequency error in accordance with the temperature, and providing synthesizer control data signals in accordance with the frequency control data and the reference frequency error wherein said microprocessor calculates the synthesizer control data in accordance with the reference frequency error;

a lookup table to calculate the reference frequency error in accordance with the temperature; and an integrated frequency synthesizer for receiving the reference frequency and synthesizer control data and generating the desired frequency output signal therefrom wherein said frequency synthesizer is a modulated fractional divider phase lock loop for generating the desired frequency output signal by changing a divide ratio in accordance with the synthesizer control data.

* * * * *